United States Patent

Boyer

[11] Patent Number: 5,844,992
[45] Date of Patent: Dec. 1, 1998

[54] FUZZY LOGIC DEVICE FOR AUTOMATIC SOUND CONTROL

[75] Inventor: Jean-Philippe Boyer, Boulogne, France

[73] Assignee: U.S. Philips Corporation, New York, N.Y.

[21] Appl. No.: 785,576

[22] Filed: Jan. 21, 1997

Related U.S. Application Data

[63] Continuation of Ser. No. 266,035, Jun. 27, 1994, abandoned.

[30] Foreign Application Priority Data

Jun. 29, 1993 [FR] France .................................. 93 07923

[51] Int. Cl.$^6$ ...................................................... H03G 3/20
[52] U.S. Cl. ............................ 381/57; 381/56; 381/104; 381/108; 395/1; 395/61; 395/900
[58] Field of Search .................................. 381/56–57, 86, 381/103–104, 106–108; 395/1, 3, 61, 900

[56] References Cited

U.S. PATENT DOCUMENTS

| | | | |
|---|---|---|---|
| 4,754,486 | 6/1988 | Stafford et al. | 381/86 |
| 4,868,881 | 9/1989 | Zwicker et al. | 381/57 |
| 4,959,865 | 9/1990 | Stettiner et al. | |
| 5,065,432 | 11/1991 | Sasaki et al. | 381/61 |
| 5,081,682 | 1/1992 | Kato et al. | 381/86 |
| 5,172,417 | 12/1992 | Iwamura | 381/103 |
| 5,212,764 | 5/1993 | Ariyoshi | 381/94.7 |
| 5,434,926 | 7/1995 | Watanabe et al. | 381/86 |
| 5,530,761 | 6/1996 | D'Alayer De Costemore D'Arc | 381/57 |
| 5,608,846 | 3/1997 | Mitsubuchi et al. | 395/900 |

FOREIGN PATENT DOCUMENTS

| | | | |
|---|---|---|---|
| 2272814 | 11/1990 | Japan . | |
| 0310548 | 1/1991 | Japan . | |
| 4207611 | 7/1992 | Japan | H03G 3/32 |

*Primary Examiner*—Paul Loomis
*Assistant Examiner*—Duc Nguyen
*Attorney, Agent, or Firm*—Leroy Eason

[57] ABSTRACT

A device for automatic sound control includes a detection circuit for supplying objective sound and/or noise measurements relating to an ambient sound volume, and a fuzzy logic control circuit for adjusting, in response to the ambient noise measurements sound transmission characteristics supplied by an acoustic device. The device includes a fuzzy logic conversion circuit which is arranged between the detection circuit and the control circuit and transforms the objective ambient noise measurements into subjective ambient noise measurements for performing said settings. The device can learn the personal settings defined by a listener. The device can also detect speech and perform specific settings.

6 Claims, 4 Drawing Sheets

FUZZY LOGIC DEVICE FOR AUTOMATIC SOUND CONTROL

This is a continuation of application Ser. No. 08/266,035, filed Jun. 27, 1994, abandoned.

BACKGROUND OF THE INVENTION

1. Field of the Invention

This invention relates to a device for automatic sound control comprising detection means for supplying objective sound and/or noise measurements relating to an ambient sound volume, and fuzzy logic control means for adjusting, in response to the ambient noise measurements, sound transmission characteristics supplied by an acoustic device.

The invention particularly relates to acoustic devices such as car radios, sound reproduction apparatuses, television apparatuses, video recorders and the like.

During their operation, the sound level of such acoustic devices may have to be adjusted with the aid of automatic controls so as to take the environment and the operating conditions in which they are used into account. In fact, the environment itself includes sound and/or noise generators with which one has to reckon, sometimes very rapidly, for adapting the sound level of the acoustic device.

A particularly significant situation occurs when a car radio or, more generally, an acoustic device is used in a motor vehicle. On the one hand, the car radio is provided with an increasingly large number of functions which requires the driver to divide his attention so as to select the adequate button for a required setting. The time he has to spend on this operation turns out to be increasingly longer, which may endanger safe driving of the vehicle. On the other hand, a vehicle is a source of various noises which cannot be completely eliminated and the intensity of these various noises often develops rapidly with traffic conditions, i.e. with the speed of the vehicle, which disturbs listening to a variable extent.

It may also be necessary to reduce the sound level of the acoustic device during a telephone call, during conversation or with other causes of ambient noise generation.

A driver cannot always divert his attention at the right moment for adjusting the car radio. An automatic control system is very important in that it relieves the listener of this task.

Similar problems likewise occur with acoustic devices situated in a fixed listening environment.

2. Description of the Related Art

To take the ambient sound volume into account and control the sound level of the acoustic device, solutions have been considered which make use of fuzzy logics. Document JP-A-4,207,611 describes a control system for an acoustic device (car radio) arranged in a vehicle. This device comprises a fuzzy logic control unit receiving, via a microphone, a measurement of the overall quantity of ambient sounds and noise and an indication of the speed of the vehicle so that the noise variations caused by speed can be taken into account.

The fuzzy logic control unit makes use of fuzzy patterns and inference rules for actions to be taken as a function of ambient noise and sound values and as a function of speed. These actions are carried out by operating a control member which adjusts the sound level of the car radio in accordance with the predetermined inference rules.

The problems which occur when realizing an efficient automatic control system reside in the fact that the detector to be taken into consideration is actually the human ear. The human ear does not behave as a simple microphone because the listener's reaction is very much dependent on his (her) sensation of noise. Moreover, it is very difficult to model this sensation of noise which turn out to be very subjective.

SUMMARY OF THE INVENTION

It is an object of the invention to provide a system in which the imprecise notions of noise perceived by the listener are taken into account.

This object is achieved with an automatic control device comprising fuzzy logic conversion means which are arranged between the detection means and the control means and which transform the objective ambient noise measurements into subjective ambient noise measurements, said conversion means supplying a subjective noise measuring signal which pilots the control means for performing said settings.

The subjective parameters may thus advantageously be used to influence the operation of the control device.

The objective measurements also relate to quantitative measurements, i.e. the sound level, as well as to qualitative measurements, i.e. the low-frequency, medium-frequency and high-frequency content of the sounds. The transformations of the objective measurements into subjective measurements are effected in the fuzzy logic means by defining fuzzy patterns and inference rules. For this purpose, the conversion means and the control means select the settings of the acoustic device in a deterministic manner by carrying out the respective pre-determined fuzzy patterns and the predetermined inference rules. The subjective measurements so obtained represent a feeling of an average listener who is present in the environment in which the acoustic device is arranged.

It is also possible to give the control device a personal touch by enabling the user to introduce personal settings. For this purpose the acoustic device has control buttons for varying the output gain or the bass-treble balance, enabling the listener to carry out personal settings. The conversion means and the control means scan these personal settings and adapt themselves to these settings accordingly. This self-adaptation may be effected one after the other at each defined personal setting. More particularly, the conversion means and the control means can take the cumulation of personal settings effected by the listener into account. The control device thus gradually learns the listener's personal wishes in the environment in which the acoustic device is used.

Moreover, the control device can distinguish between speech and music and influence the settings of the acoustic device. Speech may either be detected directly in the passenger space or in the part of the vehicle in which the device is located, or it may be detected in the signal activating the transmission member of the acoustic device. These settings are different in the two cases.

The device may be a car radio arranged in an automotive vehicle, a television set, a Compact Disc reader, a tape recorder, a video recorder or other devices arranged in a listening environment.

These and other aspects of the invention will be apparent from and elucidated with reference to the embodiments described hereinafter.

BRIEF DESCRIPTION OF THE DRAWINGS

The invention will be better understood by means of the following Figures given by way of non-limitative examples, in which.

DESCRIPTION OF THE PREFERRED EMBODIMENT

Figure 1:
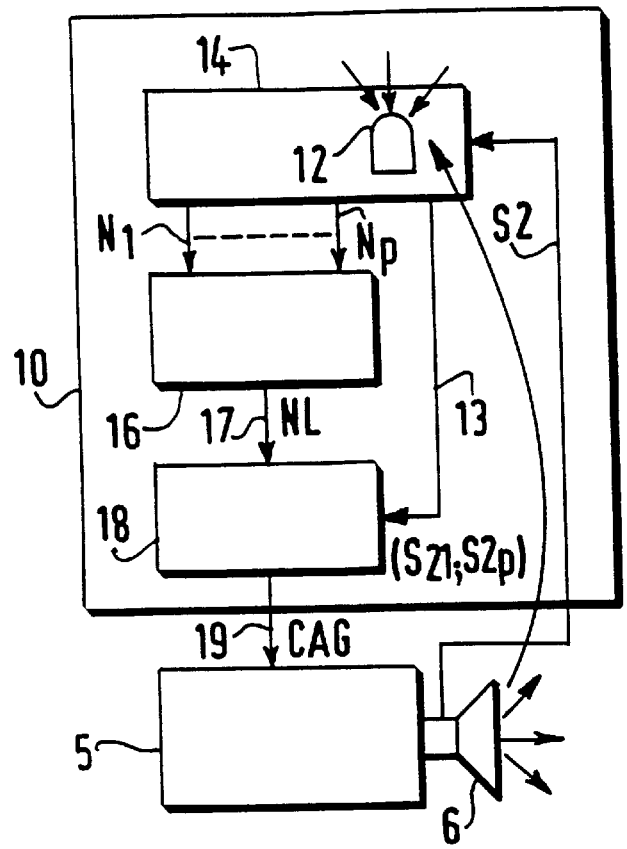
FIG. 1 shows an automatic control device according to the invention, connected to an acoustic device.

FIG. 1 shows an automatic control device 10 according to the invention, connected to an acoustic device 5. This latter device is provided with a sound transmission member 6 and a variable gain output amplifier (not shown). The device 10 comprises:

- detection means 14 for measuring a sound level and supplying objective noise measurements in the form of a plurality of components $N_1 \ldots N_p$ of noise energy in different frequency bands,
- fuzzy logic control means 18 for supplying an automatic sound control signal CAG 19 to the acoustic device 5 and
- arranged between the detection means 14 and the control means 18, fuzzy logic conversion means 16 for supplying a subjective noise measurement on the basis of the objective noise measurements. The conversion means 16 transform the noise components $N_1 \ldots N_p$ into a perception signal NL 17 measuring a noise sensation perceived by a listener.

Figure 2:
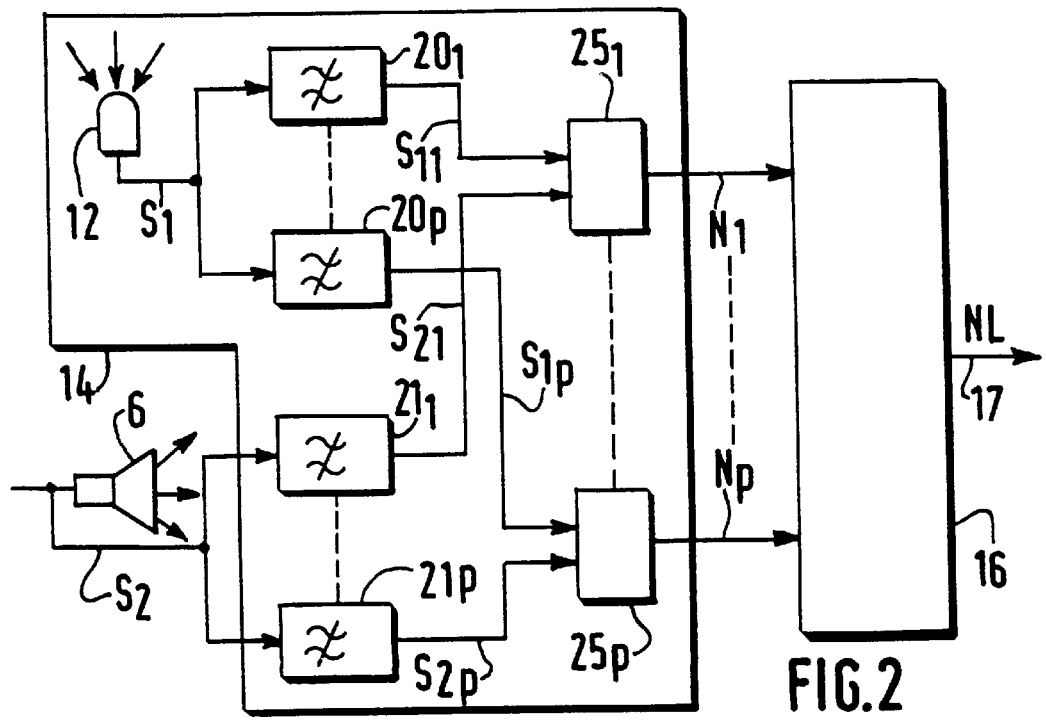
FIG. 2 shows a diagram of a means for objective measurement of ambient noise and fuzzy logic conversion means for deducing a subjective noise measurement.

According to the invention, it is taken into account that the noise perceived by the human ear is not identical to an objective noise measurement performed by a measuring instrument. Nevertheless, this objective noise measurement is to be realized before it is transformed into a subjective measurement. This objective measurement of sound characteristics is realized in the detection means 14, a detailed circuit diagram of which is shown in FIG. 2. The detection means 14 comprise a sensor 12 which picks up the ambient sounds including, in accordance with their levels, the sounds from the sound transmission member 6. The sensor may be a microphone or a detector whose output signal is correlated with the noise, for example, a speed detector in the case of a motor car, a detector of vibrations, etc.

In a first channel, the signal S1 supplied by the microphone enters a series of stages $20_1$-$20_p$ for a selective measurement of sound energy, each stage filtering the energy of the signal in respective, given parts of the frequency spectrum.

Similarly, in a second channel, the signal S2 which activates a loudspeaker (sound transmission member) is filtered by stages $21_1$-$21_p$ matched pair-wise to the preceding stages. Thus, two filtered signals measuring energy in paired frequency ranges are available at the outputs of the stages $20_1$ and $21_1$, with measurements of ambient sounds in the one case and measurements of sounds coming directly from the output of the sound device in the other case. The same applies to the other paired stages. This pair-wise arrangement may allow for different frequency details in the different channels from which S1 and S2 emanate. For example, when a microphone is used, the pair-wise matching allows for the respective characteristics of loudspeakers and microphone. Similarly, it may be useful to take the signals for the whole acoustical spectrum into account, which means that a very large bandpass filter has to be arranged and even the total number of signals can be taken for a stage and its paired stage.

Figure 3:
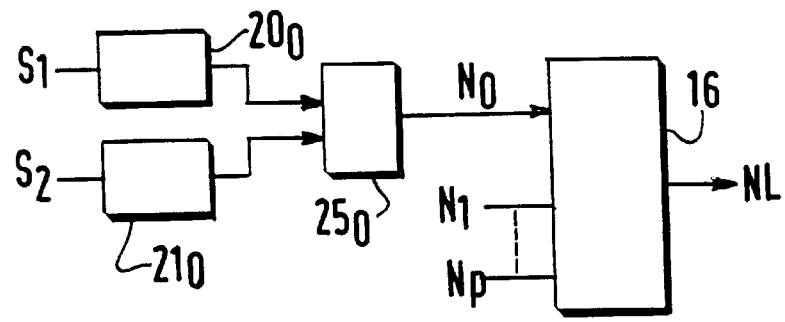
FIG. 3 shows a diagram of a part of the device with an extraction means for non-selective objective measurement of noise.
Figure 7:
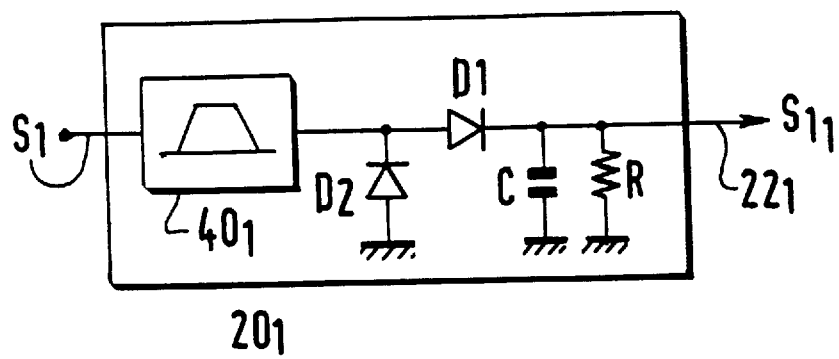
FIG. 7 is a diagram of a selective sound energy detection stage.

The signal S2 derived at the input of the loudspeaker only includes the useful sound signal. The signal S1 at the output of the microphone includes the sound signal transmitted to the microphone via the acoustic channel, as well as noise and other ambient sounds. It is thus possible to eliminate the signal S2 from the signal S1 for obtaining an objective measurement of noise and ambient sounds. This is effected on the filtered components (S11-S1p) (S21-S2p) from the pair-wise matched stages of the two channels by means of subtraction or adaptive filtering in extraction modules $25_1, \ldots 25_p$. The adaptive filtering operation may make use of the technique known as echo suppression. Noise components $N_1$-$N_p$ relating to the selected frequency ranges are then obtained. These noise components enter the fuzzy logic conversion means 16 which supply the perception signal NL giving a subjective noise measurement. More particularly, there may be detection modules $20_0$, $21_0$ and an extraction module $25_0$ (FIG. 3) which eliminate the whole of signal S2 in the signal S1. The detection modules $20_0$, $21_0$ are analogous to the modules $20_1$, $21_1$, except that the filters 40 have either a large audio band or are not present (FIG. 7). A noise component $N_0$ which is not selective in frequency is then obtained. This noise component $N_0$ participates with the other components $N_1$-$N_p$ in determining the perception signal NL.

An embodiment of a selective sound energy measurement stage, for example, stage $20_1$, is shown in FIG. 7. The stage $20_1$ comprises a low-pass or high-pass or bandpass filter $40_1$ in accordance with the chosen range of frequencies and a detection and filtering circuit for measuring the energy of the signal in the frequency range defined by the filter $40_1$. The detection and filtering circuit comprises a diode D1 which is forward-connected between the output of the filter 40, and an output $22_1$ of the circuit, a diode D2 which is reverse-connected between the output of the filter and a reference potential (ground), and an integration cell constituted by a capacitance C arranged in parallel with a resistor R connected between the output $22_1$ and the reference potential (ground). The signal S11 at the output $22_1$ represents a measurement of the energy of the input signal S1 in the frequency range defined by the filter $40_1$. Any other arrangement which provides the same function is also suitable.

The conversion means 16 and the control means 18 operate in accordance with the known fuzzy logic principles. FIGS. 4 and 5 show the essential principles in a short reminder.

Figure 4A:
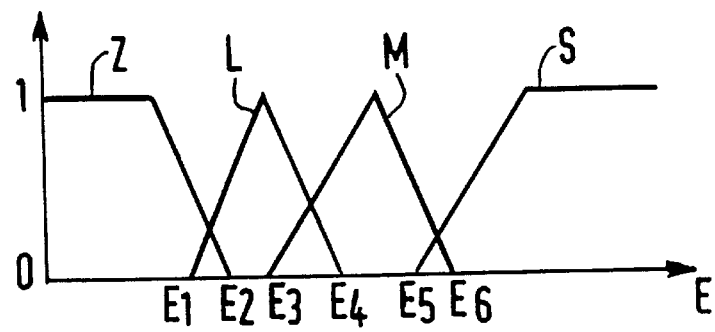
FIG. 4 is a first representation (A) of fuzzy patterns implemented by the conversion means and a second representation (B) of fuzzy patterns implemented by control means for measuring a membership degree.
Figure 5:
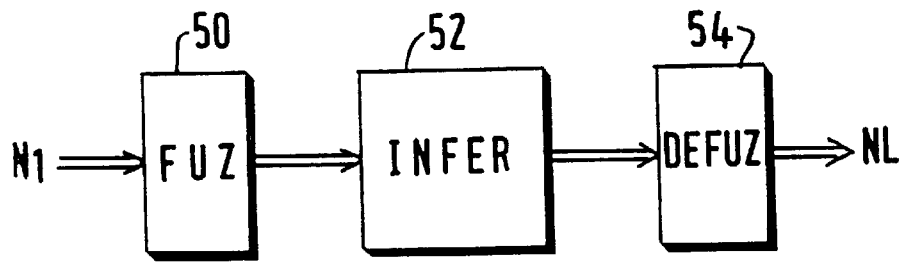
FIG. 5 is a circuit diagram of a fuzzy logic control unit.

FIG. 4A shows an example of fuzzy patterns relating to a variable, for example, the signal $N_1$ measuring the selectively filtered objective noise energy E. The following fuzzy patterns are defined:

pattern Z of zero noise where $E<E_2$
pattern L of low noise where $E_1<E<E_4$ pattern M of medium noise where $E_3 < E < E_6$
pattern S of high noise where $E > E_5$.

Figure 4B:
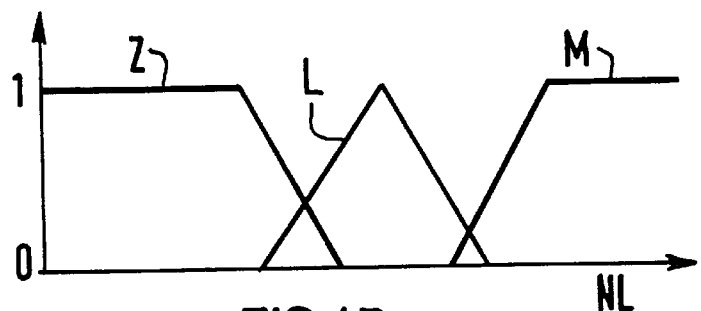

All of the components $N_0$-$N_p$ are thus translated in the same manner into fuzzy patterns which are stored in the conversion means 16. In the embodiment a current input data may thus be associated with one or several fuzzy patterns. Inference rules are subsequently applied so as to deduce a measure of subjective noise sensation. These rules are of the type "IF $N_1$ is high AND $N_0$ is medium, THEN NL is high". For each inference rule, a deduction is obtained and a signal NL for measuring the noise sensation is extracted from all the deductions. The latter operation, referred to as defuzzification, may be suppressed so as to avoid effecting the inverse operation at the input of the control means 18. The signal NL remains represented in the form of fuzzy patterns. The control means 18 also operate on the basis of fuzzy patterns and inference rules. FIG. 4B shows examples of fuzzy patterns for the control means 18, with the subjective noise level NL plotted on the abscissa and the membership degree with the fuzzy pattern plotted on the ordinate. This diagram may also be divided, for example into zero (Z), low (L) and medium (M) fuzzy patterns. The same value for NL may thus relate to one or several fuzzy patterns in accordance with several membership degrees. The control means 18 receive the subjective measurement NL and at least one selectively filtered component of the signal S2 (connection 13—FIG. 1). These filtered components are taken from the filtered components S21 to S2p supplied by the detection means 14 (FIG. 2). Subsequently, inference rules are applied. Finally a defuzzification operation is performed so as to deduce the action to be undertaken, i.e. to supply the automatic gain control signal. These fuzzy logic operations are shown diagrammatically in FIG. 5 which shows a module 50 FUZ performing a fuzzification of $N_1$, a module INFER 52 applying inference rules and a module DEFUZ 54 defuzzificating the data.

Figure 6:
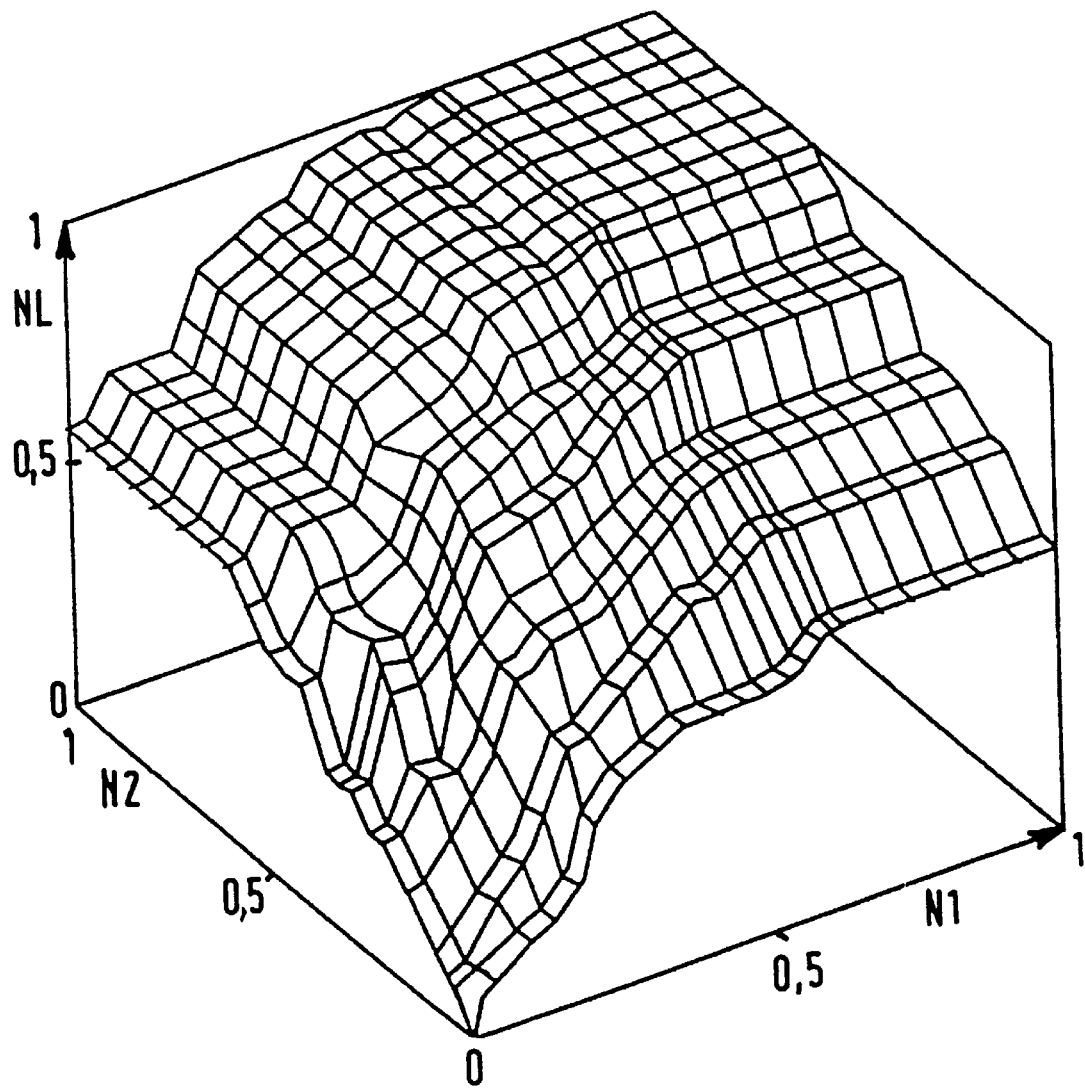
FIG. 6 is a diagram of a surface area of subjective noise measurements.

The subjective noise measurement NL depends on different noise components $N_0$-$N_p$. For a simple representation, let us consider the particular case of two components $N_1$ and $N_2$ for which the frequency ranges correspond to "BASS" and "MEDIUM", respectively. In the particular case of a subjective noise measurement for a car radio installed in a motor car, a dependence NL=f($N_1$, $N_2$) represented by the surface area in FIG. 6 was obtained. This surface area, whose analytic expression would be very complex, may be easily determined with the aid of the fuzzy logic. The complexity of this surface area increases when the number of inputs increases from two noise components to p noise components.

Figure 8:
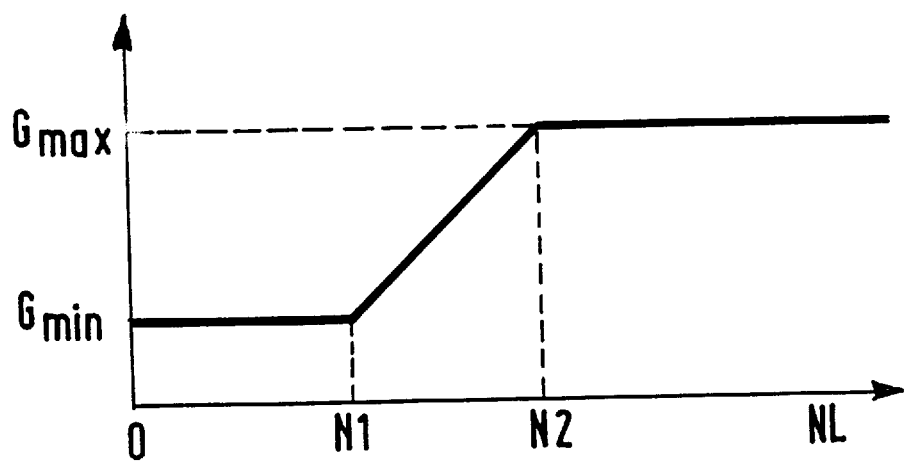
FIG. 8 is a gain characteristic as a function of the subjective noise measurement.

The control means 18 determine the control signal CAG which is applied to the amplifier of the acoustic device (FIG. 1) for modifying the signal S2 applied to the loudspeaker 6. By way of example, a rough representation of the gain dynamic variations of the amplifier as a function of the noise level NL are shown in FIG. 8. When the noise level NL is lower than $N_1$, the output amplifier gain is adjusted at a minimum value Gmin. Between $N_1$ and $N_2$ the amplifier gain may vary, for example, approximately linearly with the noise level NL. Above $N_2$, the gain is kept constant at a maximum value Gmax.

Initially, the gain curve is positioned automatically at an instantaneous measuring point of the signal S2 obtained in a noise N measured by the system at the start, when the device is switched on. This consists in measuring the level of the signal S2 imposed by the user when the device is switched on and in measuring, at the same instant, the level of the detected ambient noise. Based on the measured couple (S2, N) and the curve of FIG. 8, a curve for the signal S2 can be deduced as a function of the noise. Then, during the automatic functioning, when an instantaneous measurement of the signal S2 does not take place on this curve, an automatic gain correction will result.

According to the invention, the use of the automatic control device may be limited to a deterministic selection of settings. In this case, the fuzzy patterns and the inference rules (FIG. 4) are predetermined. To determine them, the acoustic device is installed in a given environment and, based on the noise sensations perceived by one or several listeners, the boundaries of the fuzzy patterns and the inference rules for the conversion means are determined. In operation, the automatic control device afterwards measures a subjective noise level NL and automatically adapts the sound level of the acoustic device in accordance with said fuzzy patterns and said rules.

In a particular mode, it is possible to give the automatic control device a personal touch as a function of the settings established by the listener. In this mode, the device operates, when it is first put into operation, for example, in accordance with the deterministic settings as described above. Nevertheless, in certain conditions these deterministic settings may not be convenient to the listener. For example, the emitted sound level may be either too high or too low. The listener may then manipulate control buttons on the car radio so as to adjust the sound at his convenience (volume, bass, treble). The fuzzy logic means then interpret these settings as a request for modifications and consequently modify the boundaries of the previously operating fuzzy pattern or patterns. This modification may be temporary, for example, for the operation time of the car radio, during which these settings are modified, or it may be stored in the device until there is a new setting. These settings thus become the listener's personal touch.

In a further mode, the settings successively established by the listener are progressively accumulated in a manner such that little by little the device learns to adapt itself. to the successive settings performed by the listener. Thus, an automatic control device with a personal touch is obtained. This personal touch may be obtained by modifying the boundaries of the fuzzy patterns as indicated hereinbefore or by weighting the inference rules or by associating these two operating modes. This weighting operation may be realized by applying neuronal methods. In this case, the conversion means and the fuzzy logic control means comprise neuronal means for weighting the inference rules. For example, if an inference rule is validated with a membership degree of 0.5, this degree may in its turn be revised by a weighting coefficient applied by the neuronal means.

To improve the performance of the device and take settings which have already been effected into account, the control means 18 may apply supplementary inference rules which take the already effected automatic setting into account. As described hereinbefore, when an instantaneous measurement of the signal S2 is not in conformity with the nominal curve, an automatic gain control will occur. Nevertheless, it is possible to modulate these rules in certain situations.

A modification of the sound level may not be proportionally the same according as the previous corrections have brought the sound level to a high, a medium or a low level. An inference rule may prescribe that when the last setting has modified the sound level by a given quantity, the next setting can only be modified in the case of a given different quantity. The successive settings may thus be carried out in dependence upon the settings which have preceded them.

The specific inference rules may also take the successive levels of the signal S2 into account.

It is possible to establish inference rules which take the morphology of the sound expression given by the acoustic device into account. Particularly, a piece of music may consist of sequences such as "MODERATO", "FORTE" and "PIANISSIMO", etc. It is particularly desirable that the automatic control device does not modify the sound level for supplying a "PIANISSIMO" sequence which would not be in harmony with, for example, a "FORTE" sequence.

When the device is switched on, during the initial phase of scanning the settings by the device for the purpose of detecting the blanks or the ends of the passages, the device measures the value of the average level Sref of the signal S2 given by the listener. The device then computes a new average level in an ambience having a given noise. The value of Sref (with a given noise) thus adjusted is supposed to be the correct value satisfying the listener. This value Sref is associated with a constant value Gc of the gain.

Moreover, by conception the value G of the gain applied by the device is known at any instant. It is thus possible to compute at any instant the ratio So=Gc.S2/G on the basis of the mean value of the signal S2. This ratio is compared with the value Sref of the signal S2 which corresponds to a constant gain Gc.

Subsequently, during use, it is sufficient to measure the mean current value of the signal S2 and to determine the value So for the corresponding value of the gain G.

The ratio So/Sref is converted into fuzzy patterns of the type as shown in FIG. 4A, for example in such a way that:

TABLE 1

```
very low
   low
       normal
           high
--------------------------------->
           1 So/Sref
```

When the ratio So/Sref is in the "very low" fuzzy pattern (Table 1), this means that there is a "PIANISSIMO" passage and that the gain should not be modified.

Similarly, it is desirable to detect the end of a sound transmission so as to avoid a sound level increase at this moment, which would produce too high a sound level during the subsequent repetition of the signal. This detection is realized as described hereinbefore and corresponds to the exclusive member of So/Sref to the "very low" fuzzy pattern.

Figure 9:
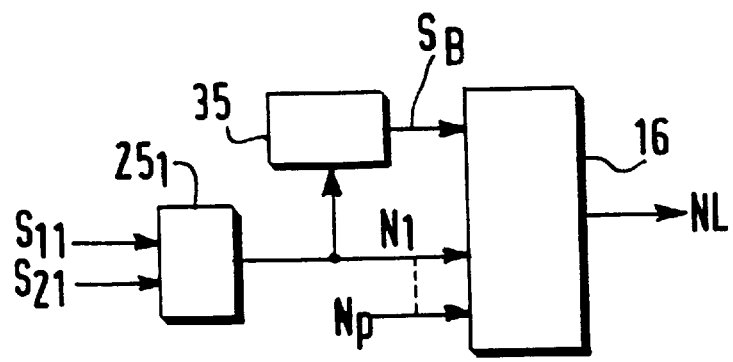
FIG. 9 is a diagram of a part of a device with a speech filtering module.

It is possible for the automatic control device to identify speech periods in the subjective noise measurement NL. For this purpose, the known fact is used that speech is constituted by sounds grouped in packets. Thus, flashes of speech can be detected. For this purpose, the fuzzy logic means compare the component N(t) measured with a delayed replica N(t-Δt). The component N(t) is chosen from those which correspond, for example, to ranges of 200 Hz to 3 kHz in which speech is usually to be found. This comparison may be realized, for example, by means of filtering. It provides a rate of high- frequency components for a speech signal which is higher than the rate corresponding to a noise signal. Based on the high- frequency components resulting from this comparison, a signal $S_B$ of speech flashes is extracted. FIG. 9 shows a filtering module 35 which determines the previous high-frequency components and the signal $S_B$.

The conversion means 16 may also perform a fuzzy logic processing on the signal $S_B$ with the aid of fuzzy patterns and specific inference rules. The conversion means 16 receive $S_B$, $N_1 \ldots N_p$. The signal $S_B$ is taken into account by adding the inference rules when speech has been detected.

Thus, when a speech signal has been detected, the automatic control device may lower the sound level supplied by the acoustic device, and inversely, when a speech signal has not been detected, it may be made to depend on the ambient noise as described hereinbefore.

The automatic control device may also identify speech periods in the signal S2 supplied to the loudspeaker. The speech may be detected in accordance with known techniques described in, for example, U.S. Pat. No. 4,959,865. When speech periods are detected in the signal S2, the device according to the invention acts on the bass/treble balance of the equalizer as a function of the ambient noise so that the intelligibility of the transmitted speech is improved. When speech periods are not detected, the signal S2 is supposed to be a music signal and appropriate settings are performed on the equalizer for adapting the bass/treble balance.

I claim:

1. An automatic sound control device comprising:

an acoustic device including a sound transmission device, detection means including sensor means responsive to ambient sound for producing a first objective signal comprising objective sound signals and objective ambient noise signals, frequency selective means responsive to said first objective signal and to a second objective signal derived from an electric audio output signal of the acoustic device so as to provide a first and second plurality of selective objective signals, and means for combining said first and second plurality of selective objective signals so as to derive a plurality of selective objective ambient noise signals, fuzzy logic conversion means coupled to the detection means and responsive to said plurality of selective objective ambient noise signals to transform said selective objective ambient noise signals into at least one subjective ambient noise signal, and fuzzy logic control means coupled to the fuzzy logic conversion means and responsive to said at least one subjective ambient noise signal to derive at its output a control signal for control of the gain of the acoustic device.

2. The automatic sound control device as claimed in claim 1 wherein said frequency selective means comprise a first plurality of detection stages responsive to the first objective signal and a second plurality of detection stages responsive to the second objective signal, and said combining means comprises a plurality of subtractor stages each of which is responsive to a respective pair of first and second selective objective signals received from the first and second pluralities of detection stages.

3. The automatic sound control device as claimed in claim 1 wherein said fuzzy logic conversion means and said fuzzy logic control means include means for storing pre-established fuzzy patterns and pre-established inference rules related to one or more listeners subjective sound perceptions determined previously during a learning procedure.

4. The automatic sound control device as claimed in claim 3 wherein the fuzzy logic conversion means and the fuzzy logic control means include means by which a listener, during operation of the acoustic device, can reset the acoustic device to a new subjective sound perception value and the values of at least one of the stored pre-established fuzzy patterns and the stored pre-established inference rules are automatically reset to satisfy the new subjective sound perception value of the listener.

5. The automatic sound control device as claimed in claim 1 wherein said acoustic device includes a variable gain amplifier whose gain is controlled by said control signal at the output of the fuzzy logic control means, and the sound transmission device comprises a loudspeaker.

6. The automatic sound control device as claimed in claim 1 wherein the detection means comprises means responsive to the first objective signal including objective ambient noise and objective sound and to the second objective signal to further supply the fuzzy logic conversion means with a non-selective objective noise measurement signal.

* * * * *